US010256037B2

(12) United States Patent
Sasaki et al.

(10) Patent No.: US 10,256,037 B2
(45) Date of Patent: Apr. 9, 2019

(54) MULTILAYER CERAMIC ELECTRONIC COMPONENT

(71) Applicant: Murata Manufacturing Co., Ltd., Nagaokakyo-shi, Kyoto-fu (JP)

(72) Inventors: Ai Sasaki, Nagaokakyo (JP); Hiroyuki Asano, Nagaokakyo (JP); Motoyuki Komatsubara, Nagaokakyo (JP); Akihiro Ehara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/826,750

(22) Filed: Nov. 30, 2017

(65) Prior Publication Data
US 2018/0082780 A1 Mar. 22, 2018

Related U.S. Application Data

(63) Continuation of application No. PCT/JP2016/066175, filed on Jun. 1, 2016.

(30) Foreign Application Priority Data

Jun. 4, 2015 (JP) .................................. 2015-113910

(51) Int. Cl.
*H02H 9/00* (2006.01)
*H01F 27/40* (2006.01)
(Continued)

(52) U.S. Cl.
CPC ......... *H01F 27/40* (2013.01); *H01F 17/0013* (2013.01); *H01F 27/2804* (2013.01);
(Continued)

(58) Field of Classification Search
CPC ....................................................... H01F 27/40
See application file for complete search history.

(56) References Cited

U.S. PATENT DOCUMENTS

| 5,134,257 | A | * | 7/1992 | Oka | ......................... F02P 7/022 |
| | | | | | 200/19.33 |
| 5,659,456 | A | * | 8/1997 | Sano | .................... H01G 4/1227 |
| | | | | | 361/303 |

(Continued)

FOREIGN PATENT DOCUMENTS

| JP | 2002-260931 A | 9/2002 |
| JP | 2004-128309 A | 4/2004 |

(Continued)

OTHER PUBLICATIONS

Official Communication issued in International Patent Application No. PCT/JP2016/066175, dated Aug. 16, 2016.

*Primary Examiner* — Stephen W Jackson
(74) *Attorney, Agent, or Firm* — Keating & Bennett, LLP

(57) ABSTRACT

A multilayer ceramic electronic component includes an electronic component element including a ceramic layer and an inner conductor, and outer electrodes disposed on the surface of the electronic component element. The outer electrodes include a first layer disposed on the surface of the electronic component element, and a second layer disposed on the first layer. The first layer includes an oxide of at least one of elements of the ceramic layer. The second layer does not include oxides of elements of the ceramic layer.

19 Claims, 7 Drawing Sheets

(51) Int. Cl.
  *H01G 4/30* (2006.01)
  *H01G 4/232* (2006.01)
  *H01F 27/28* (2006.01)
  *H01F 27/29* (2006.01)
  *H01G 4/005* (2006.01)
  *H01G 4/248* (2006.01)
  *H01G 4/40* (2006.01)
  *H03H 1/00* (2006.01)
  *H03H 7/42* (2006.01)
  *H01F 17/00* (2006.01)

(52) U.S. Cl.
  CPC ........... *H01F 27/29* (2013.01); *H01F 27/292* (2013.01); *H01G 4/005* (2013.01); *H01G 4/232* (2013.01); *H01G 4/2325* (2013.01); *H01G 4/248* (2013.01); *H01G 4/30* (2013.01); *H01G 4/40* (2013.01); *H03H 1/00* (2013.01); *H03H 7/42* (2013.01); *H01F 2017/0026* (2013.01); *H01F 2027/2809* (2013.01); *H03H 2001/0085* (2013.01)

(56) References Cited

U.S. PATENT DOCUMENTS

| | | | |
|---|---|---|---|
| 7,042,706 B2 * | 5/2006 | Nagai | H01C 1/14 156/89.12 |
| 7,813,104 B2 * | 10/2010 | Nakano | H01C 7/1006 361/301.4 |
| 2002/0039273 A1 | 4/2002 | Nakamura | |
| 2007/0242416 A1 | 10/2007 | Saito et al. | |
| 2014/0160627 A1 | 6/2014 | Kobayashi et al. | |
| 2015/0043124 A1 | 2/2015 | Kim et al. | |

FOREIGN PATENT DOCUMENTS

| | | |
|---|---|---|
| JP | 3535998 B2 | 6/2004 |
| JP | 2007-281400 A | 10/2007 |
| JP | 2010-114395 A | 5/2010 |
| JP | 2012-253245 A | 12/2012 |
| JP | 2014-116340 A | 6/2014 |
| JP | 2015-037178 A | 2/2015 |

* cited by examiner

SEM OBSERVATION

Cu MAPPING

Si MAPPING

MULTILAYER CERAMIC ELECTRONIC COMPONENT

CROSS REFERENCE TO RELATED APPLICATIONS

This application claims the benefit of priority to Japanese Patent Application No. 2015-113910 filed on Jun. 4, 2015 and is a Continuation Application of PCT Application No. PCT/JP2016/066175 filed on Jun. 1, 2016. The entire contents of each application are hereby incorporated herein by reference.

BACKGROUND OF THE INVENTION

1. Field of the Invention

The present invention relates to a multilayer ceramic electronic component obtained by co-firing an electronic component element and an outer electrode.

2. Description of the Related Art

Multilayer ceramic electronic components, such as multilayer capacitors, multilayer coils, multilayer LC filters, and multilayer baluns, include an electronic component element including a ceramic layer and an inner conductor and an outer electrode disposed on the surface of the electronic component element. Among such ceramic electronic components, Japanese Unexamined Patent Application Publication No. 2002-260931 discloses an example of multilayer baluns.

FIG. 8 is a perspective view of a multilayer balun 200 described in Japanese Unexamined Patent Application Publication No. 2002-260931. The multilayer balun 200 illustrated in FIG. 8 includes a balun element 201, and outer electrodes 202A to 202F disposed on the surface of the balun element 201.

The balun element 201 includes a dielectric ceramic layer, and inner conductors forming balanced coil patterns and an unbalanced coil pattern. The balun element 201 has a rectangular parallelepiped shape including a first surface and a second surface that are opposite to each other and are rectangular, a third surface and a fourth surface that are orthogonal to the first surface and the second surface, opposite to each other, and extend in the longitudinal direction of the first surface and the second surface, and a fifth surface and a sixth surface that are orthogonal to the first to fourth surfaces and opposite to each other. The outer electrodes 202A to 202F are disposed so as to extend over the first surface, the third surface, and the second surface of the balun element 201, so as to extend over the first surface, the fourth surface, and the second surface of the balun element 201, and so as to have a bracket shape as illustrated in the drawing.

The multilayer balun 200 has a structure in which balanced coil patterns are disposed over and under an unbalanced coil pattern so as to sandwich the unbalanced coil pattern, and the coil patterns are embedded in the balun element 201. This provides advantages of achieving a further reduction in the size and enabling production in large amounts at low cost.

The multilayer balun 200 can be obtained by co-firing a green balun element and conductor paste that is applied so as to form, after the firing, the outer electrodes 202A to 202F. During the co-firing, the dielectric ceramic layer and the conductor paste are each sintered and shrink. When the shrinkage difference between the two is large, at least one of the outer electrodes 202A to 202F may not withstand the shearing stress generated at the interface between the two, and may separate from the fired balun element 201.

SUMMARY OF THE INVENTION

Preferred embodiments of the present invention provide multilayer ceramic electronic components in which separation of an outer electrode from the electronic component element is reduced or prevented.

In preferred embodiments of the present invention, in order to provide a multilayer ceramic electronic component in which separation of an outer electrode from the electronic component element is reduced or prevented, the structure of the outer electrode is improved.

A multilayer ceramic electronic component according to a preferred embodiment of the present invention includes an electronic component element including a ceramic layer and an inner conductor; and an outer electrode disposed on a surface of the electronic component element. The outer electrode includes a first layer disposed on the surface of the electronic component element, and a second layer disposed on the first layer. The first layer includes an oxide of at least one of elements of the ceramic layer. The second layer does not include oxides of the elements of the ceramic layer.

In the multilayer ceramic electronic component, the outer electrode includes the first layer disposed on the surface of the electronic component element, and the second layer disposed so as to cover the first layer. The first layer includes an oxide of at least one of the elements of the ceramic layer. In this case, during co-firing of the electronic component element and the outer electrode, the shrinkage difference between the electronic component element and the first layer is small. As a result, the shearing stress generated at the interface between the two is low. Therefore, separation of the outer electrode from the fired electronic component element is reduced or prevented.

In addition, since the outer electrode includes the second layer that does not include oxides of the elements of the ceramic layer and that has a lower electric resistance than the first layer, an increase in the electric resistance is reduced or prevented, as compared to the case where the entirety of the outer electrode includes an oxide of an element of the ceramic layer.

A multilayer ceramic electronic component according to a preferred embodiment of the present invention preferably includes a first layer including an oxide that is the same as an oxide of the ceramic layer.

In the multilayer ceramic electronic component, the first layer includes an oxide the same as an oxide of the ceramic layer, in other words, includes a common base material. In this case, during co-firing of the electronic component element and the outer electrode, the shrinkage difference between the electronic component element and the first layer is smaller. Therefore, separation of the outer electrode from the fired electronic component element is reduced or prevented with greater certainty.

A multilayer ceramic electronic component according to a preferred embodiment of the present invention preferably includes at least a portion of the oxide included in the first layer that is sintered to be joined to the electronic component element.

In the multilayer ceramic electronic component, at least a portion of the oxide included in the first layer is sintered to be joined to the electronic component element. In this case, the oxide joined to the electronic component element extends into the outer electrode (refer to FIGS. 4A to 4C described later), which provides the anchoring effect. As a result, the outer electrode is strongly joined to the electronic component element. Therefore, separation of the outer electrode from the fired electronic component element is reduced or prevented with greater certainty.

A multilayer ceramic electronic component according to a preferred embodiment of the present invention preferably has a rectangular or substantially rectangular parallelepiped shape including a first surface and a second surface that are opposite to each other and rectangular or substantially rectangular, a third surface and a fourth surface that are orthogonal or substantially orthogonal to the first surface and the second surface, opposite to each other, and extend in a longitudinal direction of the first surface and the second surface, and a fifth surface and a sixth surface that are orthogonal or substantially orthogonal to the first to fourth surfaces and opposite to each other; and the outer electrode extends over the first surface, the third surface, and the second surface, and extends over the first surface, the fourth surface, and the second surface.

In the multilayer ceramic electronic component, the outer electrode extends over the first surface, the third surface, and the second surface, and extends over the first surface, the fourth surface, and the second surface. The first surface corresponds to the upper surface of the multilayer ceramic electronic component, the second surface corresponds to the lower surface, and the third surface and the fourth surface correspond to opposing side surfaces. In this case, even when the outer electrode is a narrow electrode that extends over the upper surface, side surfaces, and the lower surface of, in particular, a small-sized multilayer ceramic electronic component in which a sufficient joining area may not be ensured (refer to FIG. 1 described later), the above-described advantages are provided. Therefore, separation of even such an outer electrode is reduced or prevented from the fired electronic component element.

A multilayer ceramic electronic component according to a preferred embodiment of the present invention preferably is structured such that the first layer is disposed on the first surface and the second surface, and the second layer extends over the first surface, the third surface, and the second surface, and extends over the first surface, the fourth surface, and the second surface.

In the multilayer ceramic electronic component, the first layer is disposed on the first surface and the second surface. Separation of the outer electrode from the fired electronic component element tends to occur in the end portions of the outer electrode that are disposed on the first surface and the second surface, and the separation scarcely occurs from the third surface and the fourth surface. Thus, the first layer is disposed on the first surface and the second surface, to reduce or prevent, with certainty, separation of the outer electrode from the fired electronic component element.

In multilayer ceramic electronic components according to various preferred embodiments of the present invention, an outer electrode includes a first layer disposed on the surface of the electronic component element, and a second layer disposed so as to cover the first layer. The first layer includes an oxide of at least one of the elements of the ceramic layer. In this case, during co-firing of the electronic component element and the outer electrode, the shrinkage difference between the electronic component element and the first layer is small. As a result, the shearing stress generated at the interface between the two is small. Thus, separation of the outer electrode from the fired electronic component element is reduced or prevented.

In addition, since the outer electrode includes the second layer, which does not include oxides of elements of the ceramic layer and has a lower electric resistance than the first layer, an increase in the electric resistance is reduced or prevented, as compared to the case where the entirety of the outer electrode includes an oxide of an element of the ceramic layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, features of the present invention will be described in further detail with reference to preferred embodiments of the present invention.

First Preferred Embodiment

Figure 2A:
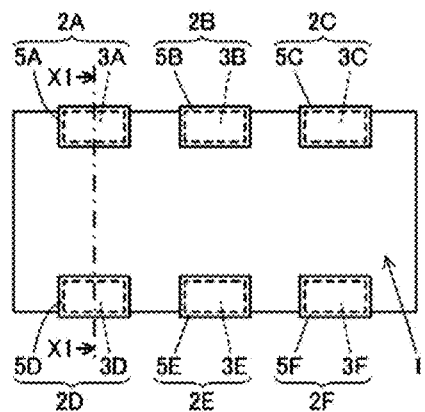
FIGS. 2A to 2D include a top view (a first surface of the electronic component element) of the multilayer ceramic electronic component 100 illustrated in FIG. 1, a bottom view (a second surface of the electronic component element), a one-side view (a third surface of the electronic component element), and an other-side view (a fourth surface of the electronic component element).
Figure 2B:
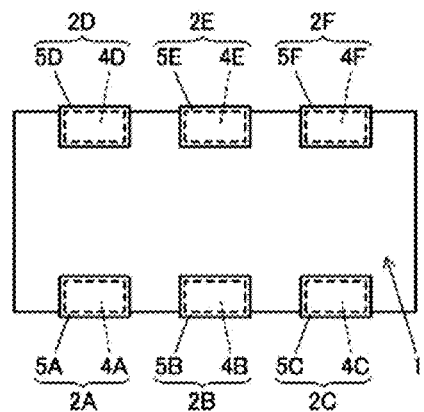
Figure 2C:
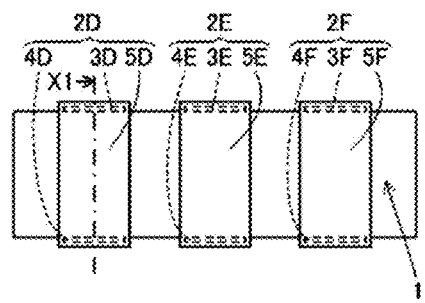
Figure 2D:
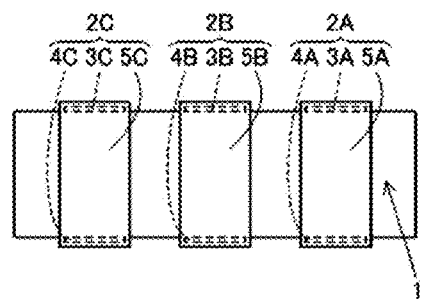
Figure 3:
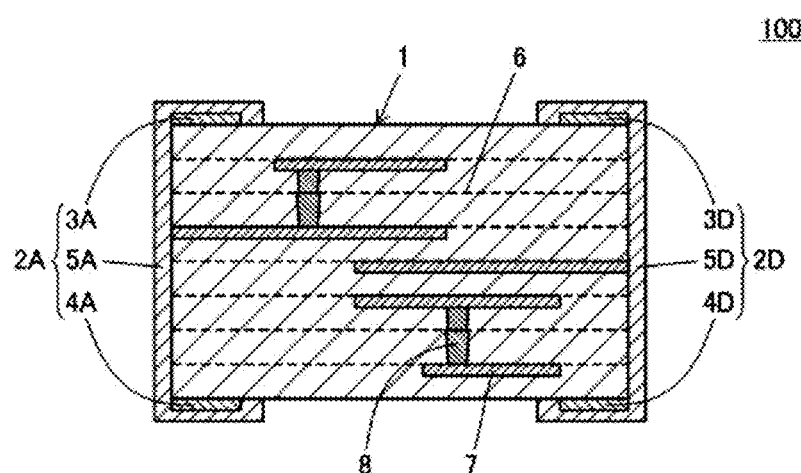
FIG. 3 is a sectional view of the multilayer ceramic electronic component 100 illustrated in FIG. 1, taken along a plane including line X1-X1 and being viewed in the direction of the arrows.

The multilayer ceramic electronic component 100 according to a first preferred embodiment of the present invention will be described with reference to FIG. 1 to FIG. 3.

Figure 1:
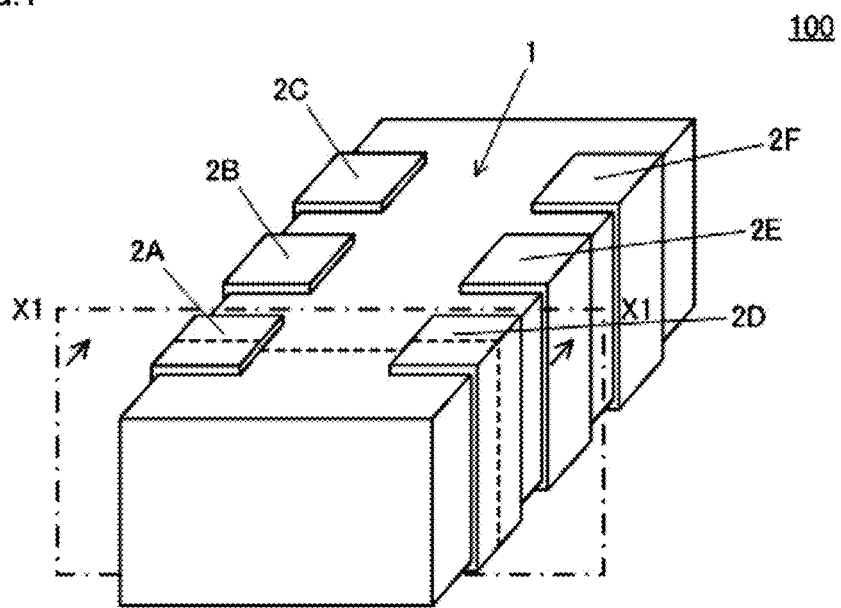
FIG. 1 is a perspective view of a multilayer ceramic electronic component 100 according to a first preferred embodiment of the present invention.

FIG. 1 is a perspective view of the multilayer ceramic electronic component 100. FIG. 2A is a top view of the multilayer ceramic electronic component 100, FIG. 2B is a bottom view, FIG. 2C is a one-side view, and FIG. 2D is an other-side view. FIG. 3 is a sectional view of the multilayer ceramic electronic component 100 taken along a plane (illustrated with a dash-dot line) including line X1-X1 in FIG. 1 and FIGS. 2A to 2D and viewed in the direction of the arrows.

The multilayer ceramic electronic component 100 includes an electronic component element 1, and outer electrodes 2A to 2F, which are disposed on the surface of the electronic component element. As illustrated in FIG. 3, the electronic component element 1 includes ceramic layers 6, and, as inner conductors, pattern conductors 7 and via conductors 8.

The ceramic layers 6 preferably include a ceramic material that is a Ba—Al—Si-based oxide, for example. The inner conductors are preferably made of Cu, for example. Incidentally, in FIG. 3, dotted lines are drawn within the electronic component element 1. These dotted lines represent ceramic green sheets stacked and sintered to provide the electronic component element 1. However, the actual element does not include such interfaces.

The pattern conductors 7 and via conductors 8 and the ceramic layers 6 are appropriately combined to define, for example, an inductor and a capacitor within the electronic component element 1. A predetermined number of such inductors and capacitors are provided in a predetermined arrangement, to provide the multilayer ceramic electronic component 100 as, for example, a multilayer LC filter and a multilayer balun.

The electronic component element 1 according to the first preferred embodiment preferably has a rectangular or substantially rectangular parallelepiped shape including a first surface and a second surface that are opposite to each other and are rectangular or substantially rectangular, a third surface and a fourth surface that are orthogonal or substantially orthogonal to the first surface and the second surface, opposite to each other, and extend in the longitudinal direction of the first surface and the second surface, and a fifth surface and a sixth surface that are orthogonal or substantially orthogonal to the first to fourth surfaces and opposite to each other. The first surface corresponds to the upper surface of the electronic component element 1, and the second surface corresponds to the lower surface. The third surface corresponds to one side surface of the electronic component element 1, and the fourth surface corresponds to the other side surface. The fifth surface corresponds to one end surface of the electronic component element 1, and the sixth surface corresponds to the other end surface.

The actual electronic component elements are often subjected to, for example, barrel finishing in order to cut away their ridges and corner portions. As a result of this, the outer electrodes also have a rounded shape. On the other hand, FIG. 1 to FIG. 3 illustrate the electronic component element 1 as having a rectangular or substantially rectangular parallelepiped shape having ridges and corner portions. These schematically illustrate the electronic component elements of the actual multilayer ceramic electronic components, and do not mean that the actual multilayer ceramic electronic components have ridges and corner portions.

The outer electrode 2A includes first layers 3A and 4A, which are disposed on the first surface and the second surface of the electronic component element 1, and a second layer 5A, which is disposed so as to cover the first layers 3A and 4A and extend over the first surface, the third surface, and the second surface (refer to FIGS. 2A to 2D and FIG. 3). The outer electrode 2D includes first layers 3D and 4D, which are disposed on the first surface and the second surface of the electronic component element 1, and a second layer 5D, which is disposed so as to cover the first layers 3D and 4D and extend over the first surface, the fourth surface, and the second surface (refer to FIGS. 2A to 2C and FIG. 3).

In other words, preferably the outer electrodes 2A and 2D extend over the first surface, the third surface, and the second surface of the electronic component element 1 extends over the first surface, the fourth surface, and the second surface, so as to have a bracket shape in the drawings. As illustrated in FIGS. 2A to 2D and FIG. 3, the outer electrodes 2B, 2C, 2E, and 2F have the same or substantially the same structure as the outer electrodes 2A and 2D. Incidentally, as described above, the outer electrodes 2A to 2F are schematically illustrated, which are rounded outer electrodes in the actual multilayer ceramic electronic component.

The first layers 3A and 4A of the outer electrode 2A in the first preferred embodiment preferably include Cu as a conductive component, and further include, as a common base material, an oxide the same or substantially the same as the Ba—Al—Si-based oxide of the ceramic layers 6. As in the outer electrode 2A, in the outer electrodes 2B to 2F, the first layers 3B to 3F and 4B to 4F preferably include, as a common base material, an oxide the same or substantially the same as the Ba—Al—Si-based oxide of the ceramic layers 6. The oxide included in the first layers may not necessarily be the common base material of the ceramic layers 6 as long as the first layers include an oxide of at least one of the elements of the ceramic layers 6.

On the other hand, the second layer 5A of the outer electrode 2A does not include oxides of elements of the ceramic layers 6. In the present preferred embodiment, the second layer 5A is preferably substantially made of Cu, for example, which is a conductive component. As in the outer electrode 2A, in the outer electrodes 2B to 2F, the second layers 5B to 5F do not include oxides of elements of the ceramic layers 6; the second layers 5B to 5F are preferably substantially made of Cu, for example, which is a conductive component. The second layers 5A to 5F, which do not include oxides of elements of the ceramic layers 6, have an electric resistance lower than that of the first layers 3A to 3F and 4A to 4F. The second layers 5A to 5F may be made of a single metal other than Cu or an alloy, and may preferably include an oxide of an element other than the elements of the ceramic layers 6 as long as the electric resistance is lower than that of the first layers. The second layers 5A to 5F may preferably include a Cu layer and a plating layer made of, for example, Ni and Sn and provided on the Cu layer (refer to FIGS. 4A and 4B).

In the multilayer ceramic electronic component 100, the first layers 3A to 3F and 4A to 4F include a common base material of the ceramic layers 6. Thus, as described later, during co-firing of the electronic component element 1 and the outer electrodes 2A to 2F, the shrinkage difference between the electronic component element and the first layers 3A to 3F and 4A to 4F is small. As a result, the shearing stress generated at the interfaces between the electronic component element and the first layers is low. Therefore, separation of the outer electrodes 2A to 2F from the fired electronic component element 1 is reduced or prevented.

The outer electrodes 2A to 2F include the second layers 5A to 5F, which do not include oxides of elements of the ceramic layers 6 and have a lower electric resistance than the first layers 3B to 3F and 4B to 4F. Thus, an increase in the electric resistance is reduced or prevented, as compared to the case where the entirety of the outer electrodes includes an oxide of an element of the ceramic layers 6.

The mechanism of reducing or preventing the separation will be described further in detail with reference to FIGS. 4A to 4C.

Figure 4A:
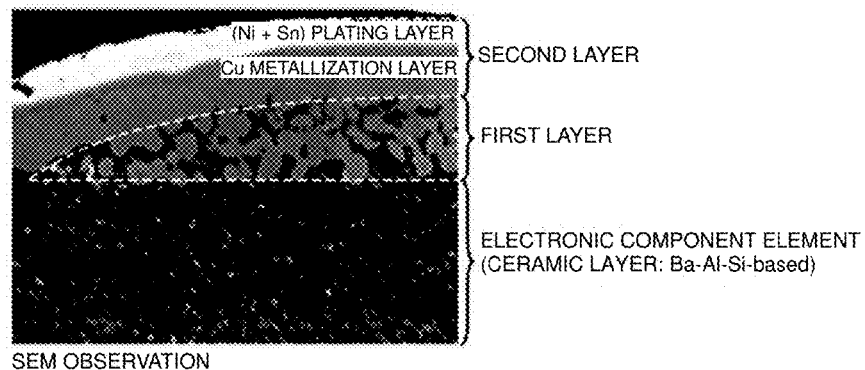
FIGS. 4A to 4C include a SEM observation micrograph of a section of a multilayer ceramic electronic component corresponding to the multilayer ceramic electronic component 100 illustrated in FIG. 1, a Cu mapping analysis result and a Si mapping analysis result for the same region as in the SEM observation micrograph of the section.

FIG. 4A is a SEM observation micrograph of a section of a multilayer ceramic electronic component corresponding to the multilayer ceramic electronic component 100. FIG. 4B is a Cu mapping analysis result of the same region as in the SEM observation micrograph of the section; and FIG. 4C is a Si mapping analysis result.

Figure 4B:
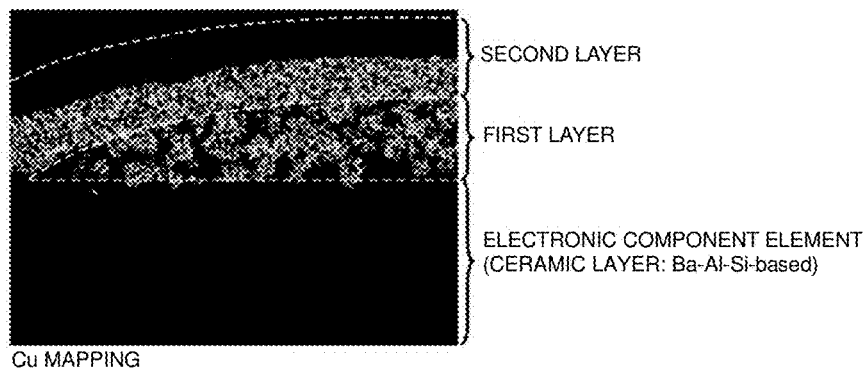
Figure 4C:
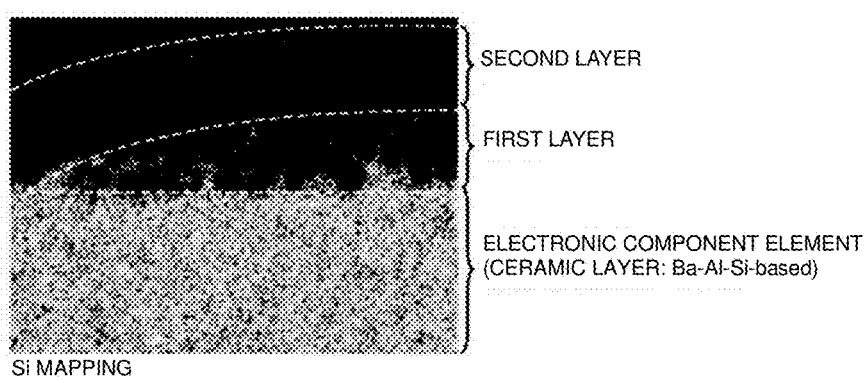

As is understood from FIGS. 4A to 4C, in a multilayer ceramic electronic component according to the present preferred embodiment, on the surface of the electronic component element including Ba—Al—Si-based ceramic layers, the first layers including Cu and a common base material of the ceramic layers are disposed. In addition, the second layers including a Cu metallization layer and a Ni—Sn plating layer are disposed so as to cover the first layers.

When the first layers include the common base material, during co-firing of the electronic component element and the outer electrodes, the shrinkage difference between the electronic component element and the first layers is small. In addition, at least a portion of the common base material included in the first layers is sintered to be joined to the electronic component element, and the joined portion extends into the outer electrodes, which provides an anchoring effect. In other words, the shearing stress generated at the interfaces between the electronic component element and the outer electrodes is reduced or prevented, and the outer electrodes are strongly joined to the electronic component element. As a result, separation of the outer electrodes from the fired electronic component element is reduced or prevented with greater certainty.

As described above, when an oxide included in the first layers is an oxide of at least one of the elements of the ceramic layers, the shrinkage difference between the electronic component element and the first layers is small during co-firing of the electronic component element and the outer electrodes. Thus, separation of the outer electrodes from the fired electronic component element is reduced or prevented.

A non-limiting example of a method for producing the multilayer ceramic electronic component 100 illustrated in FIG. 1 to FIG. 3 will be described with reference to FIGS. 5A to 5E.

Figure 5A:
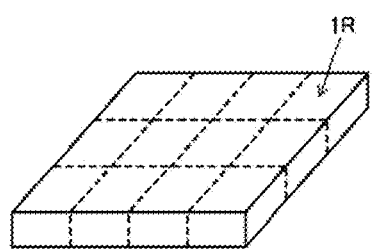
FIGS. 5A to 5E illustrate an example of a method for producing the multilayer ceramic electronic component 100 illustrated in FIG. 1, and includes schematic perspective views illustrating the states of the multilayer ceramic electronic component in a step of preparing a green electronic component element, a step of applying an outer electrode paste for first layers, a cutting step, a step of applying an outer electrode paste for second layers, and a firing step.

FIG. 5A is a perspective view schematically illustrating the state of a multilayer ceramic electronic component in a step of preparing a green electronic component element in the method for producing the multilayer ceramic electronic component 100. In the step of preparing a green electronic component element in this preferred embodiment, green electronic component elements 1R are preferably prepared as a collective member. Alternatively, in the step of preparing a green electronic component element, the collective member of green electronic component elements 1R may be cut into individual elements.

In this step, a ceramic material powder is first used to prepare ceramic green sheets. Subsequently, on such ceramic green sheets, pattern conductors and via conductors are formed with a conductor paste. Ceramic green sheets including those having the pattern conductors and the via conductors are laminated by pressure-bonding so as to form inner conductors having a predetermined path. Thus, the collective member of green electronic component elements 1R is prepared. In FIG. 5A, dotted lines are drawn on the collective member of the green electronic component elements 1R. However, these lines represent cutting positions in a cutting step described later, and such interfaces are not present on the actual collective member.

Figure 5D:
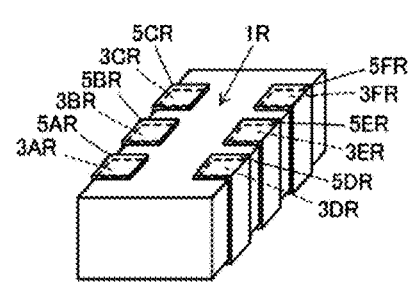
Figure 5B:
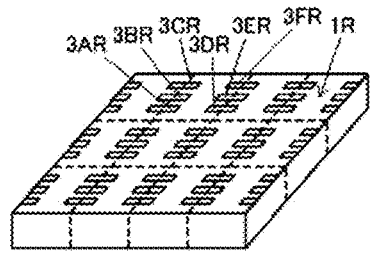

FIG. 5B is a perspective view schematically illustrating the state of a multilayer ceramic electronic component in a step of applying an outer electrode paste for first layers in the method for producing the multilayer ceramic electronic component 100. The outer electrode paste for the first layers includes, as solid content, a metal conductor and a common base material of the ceramic layer 6. In the step of applying an outer electrode paste for the first layers in this preferred embodiment, the outer electrode paste for the first layers is preferably applied onto the collective member of the green electronic component elements 1R. The outer electrode paste for the first layers may be applied to the green electronic component elements 1R having been provided as individual elements.

In this step, the outer electrode paste for the first layers is applied onto the upper surface and the lower surface of the collective member of the green electronic component elements 1R to form green first layers 3AR to 3FR on the upper surface and to form green first layers 4AR to 4FR (not shown) on the lower surface. The outer electrode paste for the first layers may be applied with a printing apparatus that is ordinarily used for flat printing, such as screen printing, for example. In this case, the green first layers 3AR to 3FR and 4AR to 4FR are provided so as to be partially joined together such that the collective member is to be cut in the cutting step described below to provide individual elements of the green electronic component elements 1R having a predetermined shape. Also in FIG. 5B, positions where the cutting is to be performed are marked with dotted lines.

Figure 5E:
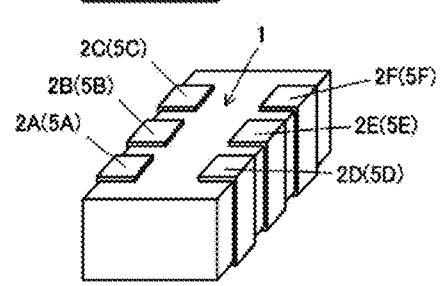
Figure 5C:
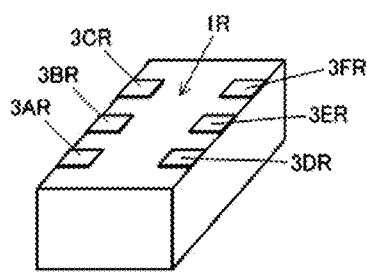

FIG. 5C is a perspective view schematically illustrating the state of a multilayer ceramic electronic component in the cutting step in the method for producing the multilayer ceramic electronic component 100. As described above, the cutting step may be included in the step of preparing a green electronic component element.

In this step, the collective member of the green electronic component elements 1R is preferably cut to provide individual elements of the green electronic component elements 1R. The collective member may be cut with a cutting apparatus ordinarily used, such as a dicing saw, for example. After the cutting step, barrel finishing may be performed as necessary to cut away the ridges and corner portions.

FIG. 5D is a perspective view schematically illustrating the state of a multilayer ceramic electronic component in a step of applying an outer electrode paste for the second layers in the method for producing the multilayer ceramic electronic component 100. The outer electrode paste for the second layers includes, as solid content, a metal conductor and does not include the common base material of the ceramic layer 6, which is included in the outer electrode paste for the first layers.

In this step, green second layers 5AR to 5FR are formed so as to cover the green first layers 3AR to 3FR and 4AR to 4FR (not shown). Specifically, the green second layers 5AR to 5FR are formed so as to extend over the first surface (upper surface), the third surface (one side surface), and the second surface (lower surface) of the green electronic component element 1R, so as to extend over the first surface, the fourth surface (the other side surface), and the second surface, and so as to have a bracket shape in the drawing. The outer electrode paste for the second layers may be applied with a coating apparatus ordinarily used for coating of plural surfaces, such as a dipping apparatus, for example.

FIG. 5E is a perspective view schematically illustrating the state of a multilayer ceramic electronic component in a firing step in the method for producing the multilayer ceramic electronic component 100.

In this step, the green electronic component element 1R provided with the green outer electrodes is fired. In other words, the electronic component element and the outer electrodes are co-fired. The firing conditions are appropriately set in accordance with the properties of the ceramic material included in the ceramic layers 6, the properties of the material of the inner conductors, and the properties of the material of the outer electrodes.

The production method enables efficient production of the multilayer ceramic electronic component 100 according to a preferred embodiment of the present invention.

Second to Seventh Preferred Embodiments

Multilayer ceramic electronic components 100A to 100F corresponding to multilayer ceramic electronic components according to second to seventh preferred embodiments of the present invention will be described with reference to FIGS. 6A to 6C and FIGS. 7A to 7C.

Figure 6A:
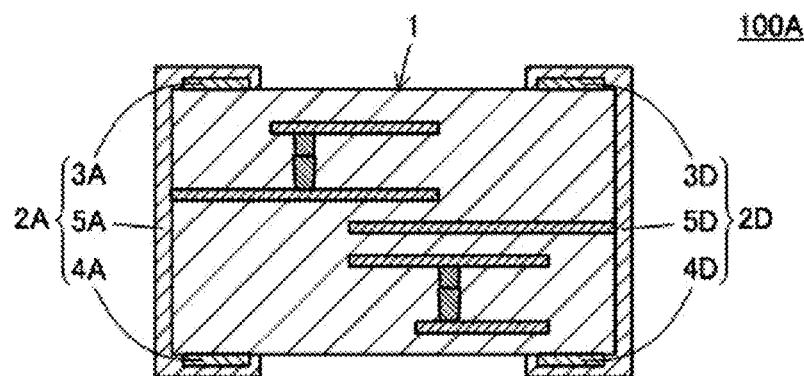
FIGS. 6A to 6C include sectional views of multilayer ceramic electronic components 100A to 100C according to second to fourth preferred embodiments of the present invention, the sectional views corresponding to a sectional view that is taken along a plane including line X1-X1 in FIG. 1 and is viewed in the direction of the arrows.

FIG. 6A is a sectional view of the multilayer ceramic electronic component 100A corresponding to a multilayer ceramic electronic component according to the second preferred embodiment of the present invention. In the multilayer ceramic electronic component 100, the first layers of the outer electrodes 2A to 2F are disposed so as to extend to the third surface and the fourth surface of the electronic component element 1, on the first surface and the second surface. On the other hand, in the multilayer ceramic electronic component 100A, the first layers of the outer electrodes 2A to 2F are preferably disposed so as not to extend to the third surface and the fourth surface of the electronic component element 1, and are disposed only on the first surface and the second surface.

Separation of the outer electrodes from the fired electronic component element tends to occur, in particular, in the end portions of portions (disposed on the first surface and the second surface) of the outer electrodes. In the multilayer ceramic electronic component 100A, since at least the end portions of the outer electrodes include the first layer including an oxide and the second layer not including oxides as described above, separation of the outer electrodes is reduced or prevented.

Figure 6B:
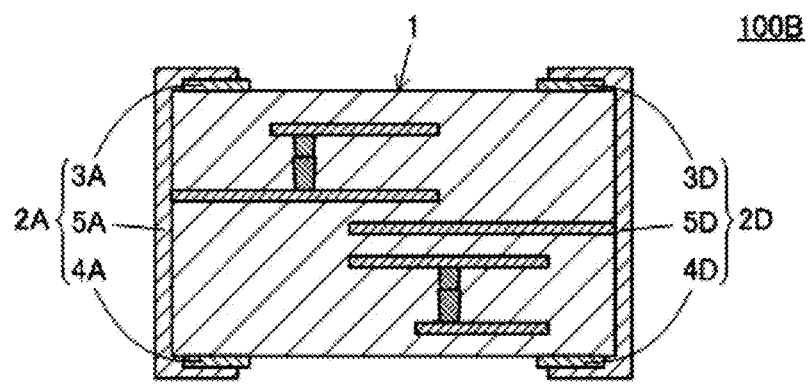

FIG. 6B is a sectional view of the multilayer ceramic electronic component 100B corresponding to a multilayer ceramic electronic component according to the third preferred embodiment of the present invention. In the multilayer ceramic electronic component 100, the second layers of the outer electrodes 2A to 2F are disposed so as to cover the entirety of the first layers. On the other hand, in the multilayer ceramic electronic component 100B, the end portions of the first layers are preferably not covered by the second layers.

For example, when the multilayer ceramic electronic component 100 is produced such that the second layers include a Cu metallization layer and a Ni—Sn plating layer, separation of the fired outer electrodes 2A to 2F from the electronic component element 1 is reduced or prevented. However, the plating solution may enter the interfaces between the electronic component element 1 and the second layers, which may cause separation. In the multilayer ceramic electronic component 100B, the end portions of the outer electrodes 2A to 2F are the second layers having high adhesion to the electronic component element 1, so that entry of the plating solution and the resultant separation are reduced or prevented.

Figure 6C:
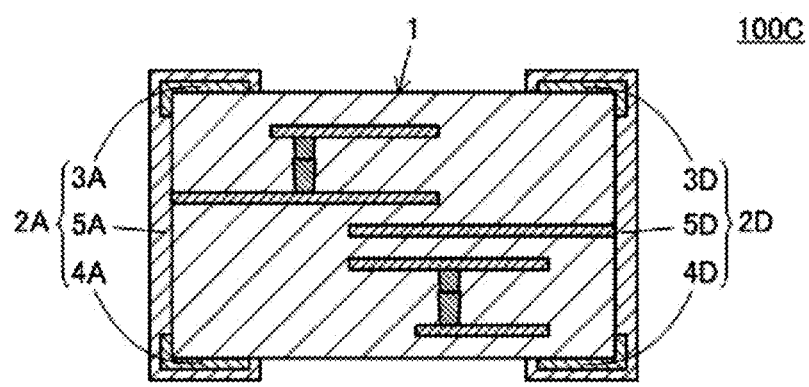

FIG. 6C is a sectional view of the multilayer ceramic electronic component 100C corresponding to a multilayer ceramic electronic component according to the fourth preferred embodiment of the present invention. In the multilayer ceramic electronic component 100, the first layers of the outer electrodes 2A to 2F extend to the third surface and the fourth surface of the electronic component element 1, but are disposed only on the first surface and the second surface. On the other hand, in the multilayer ceramic electronic component 100C, the first layers of the outer electrodes 2A to 2F preferably extend over the first surface and the third surface, over the second surface and the third surface, over the first surface and the fourth surface, and over the second surface and the fourth surface of the electronic component element 1, and so as to have an L-shape.

When the outer electrodes have a small area, the adhesion strength between the outer electrodes and the electronic component element may be low. In the multilayer ceramic electronic component 100C, the first layers preferably extend to the third layer and the fourth layer. This causes an increase in the adhesion strength between the outer electrodes 2A to 2F and the electronic component element 1. Thus, even when the outer electrodes have a small area, separation of the outer electrodes is reduced or prevented.

Figure 7A:
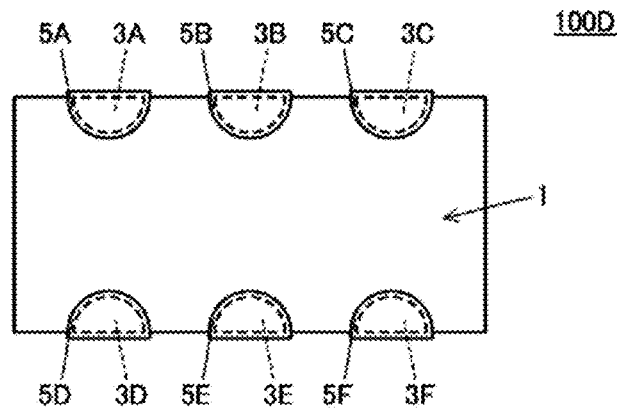
FIGS. 7A to 7C include top views of multilayer ceramic electronic components 100D to 100F according to fifth to seventh preferred embodiments of the present invention, the top views corresponding to the top view in FIGS. 2A to 2D.

FIG. 7A is a top view of the multilayer ceramic electronic component 100D corresponding to a multilayer ceramic electronic component according to the fifth preferred embodiment of the present invention. In the multilayer ceramic electronic component 100, the first layers and the second layers of the outer electrodes 2A to 2F disposed on the first surface and the second surface preferably have rectangular or substantially rectangular shapes. As illustrated in FIG. 7A, the first layers and the second layers of the outer electrodes 2A to 2F disposed on the first surface and the second surface may preferably have shapes other than rectangular or substantially rectangular shapes, such as semicircular or substantially semicircular shapes, for example. In this case, the same or similar advantages as in the multilayer ceramic electronic component 100 are provided.

Figure 7B:
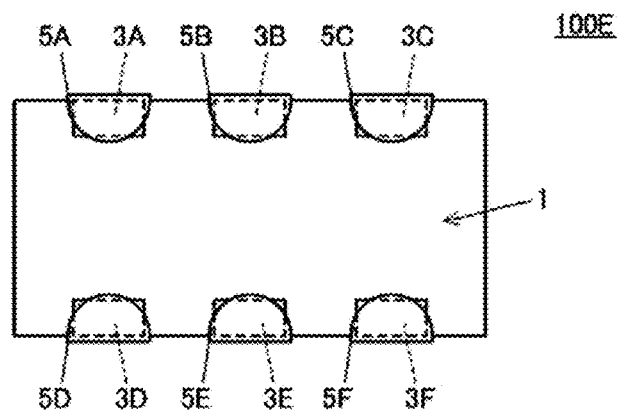

FIG. 7B is a top view of the multilayer ceramic electronic component 100E corresponding to a multilayer ceramic electronic component according to the sixth preferred embodiment of the present invention. In the multilayer ceramic electronic component 100, the first layers and the second layers of the outer electrodes 2A to 2F disposed on the first surface and the second surface preferably have rectangular or substantially rectangular shapes. As illustrated in FIG. 7B, the first layers and the second layers of the outer electrodes 2A to 2F disposed on the first surface and the second surface may have different shapes, for example, the first layers may have a rectangular or substantially rectangular shape, and the second layers may have a semicircular or substantially semicircular shape. In this case, the corner portions of the first layers are exposed from the second layers. In this case, since the second layers have no corner portions, separation due to plating is further reduced or prevented.

Figure 7C:
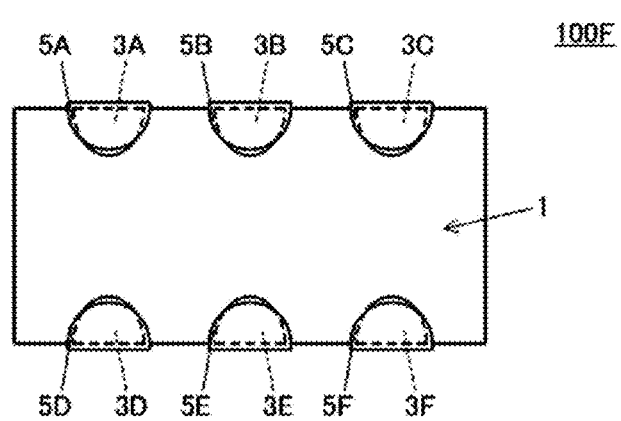
Figure 8:
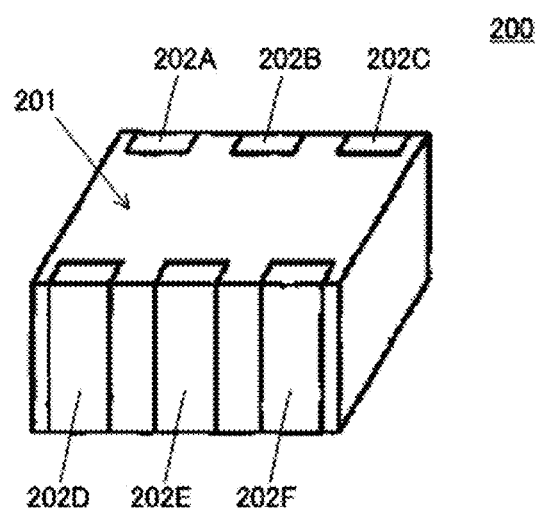
FIG. 8 is a perspective view of a multilayer balun (multilayer ceramic electronic component) 200 in the related art.

FIG. 7C is a top view of the multilayer ceramic electronic component 100F corresponding to a multilayer ceramic electronic component according to the seventh preferred embodiment of the present invention. As in FIG. 7B, in FIG. 7C, the first layers and the second layers of the outer electrodes 2A to 2F disposed on the first surface and the second surface have different shapes. In FIG. 7C, the first layers preferably have a semielliptical or substantially semielliptical shape, and the second layers have a semicircular or substantially semicircular shape. In this case, since the second layers does not include any corner portions, separation due to plating is further reduced or prevented. In addition, since the first layers preferably are exposed from the ends of the second layers, separation during firing is also further reduced or prevented.

Note that the present invention is not limited to the above-described preferred embodiments, and various applications and modifications may be made within the scope of the present invention. Specifically, preferred embodiments of the present invention are applicable to multilayer ceramic electronic components that include an electronic component element including a ceramic layer and an inner conductor, and an outer electrode disposed on the surface of the electronic component element. For example, the following may be appropriately changed in accordance with the required functions of the multilayer ceramic electronic component: the oxide used for the ceramic layers, the positions where the inner conductors are provided and the resultant circuit configuration, the material, number, and positions of the outer electrodes, and the ratio of an oxide and a conductive component in the first layers.

Note that the preferred embodiments described herein, and substitution or combination of some features or elements in different preferred embodiments may be made.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed:

1. A multilayer ceramic electronic component comprising:
    an electronic component element including a ceramic layer and an inner conductor; and
    an outer electrode disposed on a surface of the electronic component element; wherein
    the outer electrode includes a first layer disposed on the surface of the electronic component element, and a second layer disposed on the first layer;
    the first layer includes an oxide of at least one of elements of the ceramic layer; and
    the second layer does not include oxides of the elements of the ceramic layer.

2. The multilayer ceramic electronic component according to claim 1, wherein the first layer includes an oxide that is the same as an oxide of the ceramic layer.

3. The multilayer ceramic electronic component according to claim 1, wherein at least a portion of the oxide included in the first layer is made of a sintered material and joined to the electronic component element.

4. The multilayer ceramic electronic component according to claim 1, wherein
    the electronic component element has a rectangular or substantially rectangular parallelepiped shape including a first surface and a second surface that are opposite to each other and rectangular or substantially rectangular, a third surface and a fourth surface that are orthogonal or substantially orthogonal to the first surface and the second surface, opposite to each other, and extend in a longitudinal direction of the first surface and the second surface, and a fifth surface and a sixth surface that are orthogonal or substantially orthogonal to the first to fourth surfaces and opposite each other; and
    the outer electrode extends over the first surface, the third surface, and the second surface, and extends over the first surface, the fourth surface, and the second surface.

5. The multilayer ceramic electronic component according to claim 4, wherein the first layer is disposed on the first surface and the second surface; and
    the second layer extends over the first surface, the third surface, and the second surface, and so as to extend over the first surface, the fourth surface, and the second surface.

6. The multilayer ceramic electronic component according to claim 1, wherein the inner conductor includes a pattern conductor and a via conductor.

7. The multilayer ceramic electronic component according to claim 1, wherein the ceramic layer includes a ceramic material that is a Ba—Al—Si-based oxide.

8. The multilayer ceramic electronic component according to claim 1, wherein the inner conductor is made of Cu.

9. The multilayer ceramic electronic component according to claim 1, wherein the inner conductor includes a plurality of inner conductors that define an inductor and a capacitor.

10. The multilayer ceramic electronic component according to claim 4, wherein the first layer extends to the third surface and the fourth surface on the first surface and the second surface, but not onto the third surface and the fourth surface.

11. The multilayer ceramic electronic component according to claim 4, wherein the first layer does not extend to the third surface and the fourth surface and is disposed only on the first surface and the second surface.

12. The multilayer ceramic electronic component according to claim 1, wherein the second layer covers an entirety of the first layer.

13. The multilayer ceramic electronic component according to claim 1, wherein an end portion of the first layer is not covered by the second layer.

14. The multilayer ceramic electronic component according to claim 4, wherein the first layer extends over the first surface and the third surface, over the second surface and the third surface, over the first surface and the fourth surface, and over the second surface and the fourth surface.

15. The multilayer ceramic electronic component according to claim 4, wherein the first layer and the second layer disposed on the first surface and the second surface have rectangular or substantially rectangular shapes.

16. The multilayer ceramic electronic component according to claim 4, wherein the first layer and the second layer disposed on the first surface and the second surface have semicircular or substantially semicircular shapes.

17. The multilayer ceramic electronic component according to claim 4, wherein the first layer and the second layer disposed on the first surface and the second surface have different shapes from one another.

18. The multilayer ceramic electronic component according to claim 17, wherein the first layer has a rectangular or substantially rectangular shape, and the second layer has a semicircular or substantially semicircular shape.

19. The multilayer ceramic electronic component according to claim 17, wherein the first layer has a semielliptical or substantially semielliptical shape, and the second layer has a semicircular or substantially semicircular shape.

* * * * *